US007203320B2

(12) United States Patent
Coats et al.

(10) Patent No.: US 7,203,320 B2
(45) Date of Patent: Apr. 10, 2007

(54) SUB-HARMONIC GENERATOR AND STEREO EXPANSION PROCESSOR

(75) Inventors: Elon Ray Coats, Meridian, MS (US); Earnest Lloyd Trammell, Meridian, MS (US)

(73) Assignee: Peavey Electronics Corporation, Meridian, MS (US)

(*) Notice: Subject to any disclaimer, the term of this patent is extended or adjusted under 35 U.S.C. 154(b) by 0 days.

(21) Appl. No.: 11/053,716

(22) Filed: Feb. 8, 2005

(65) Prior Publication Data

US 2005/0147254 A1 Jul. 7, 2005

Related U.S. Application Data

(62) Division of application No. 09/727,903, filed on Dec. 1, 2000, now Pat. No. 7,136,493.

(60) Provisional application No. 60/218,805, filed on Jul. 18, 2000, provisional application No. 60/214,804, filed on Jun. 28, 2000.

(51) Int. Cl.
*H04R 5/00* (2006.01)
*H03G 3/00* (2006.01)

(52) U.S. Cl. .............................. 381/1; 381/17; 381/61

(58) Field of Classification Search .................... 381/1, 381/17, 18, 27, 61, 98
See application file for complete search history.

(56) References Cited

U.S. PATENT DOCUMENTS 4,182,930 A 1/1980 Blackner
4,841,572 A 6/1989 Klayman
4,866,774 A 9/1989 Klayman
4,980,914 A * 12/1990 Kunugi et al. ................. 381/1
5,369,224 A 11/1994 Miyata
5,420,929 A * 5/1995 Geddes et al. ................. 381/1
5,440,638 A 8/1995 Lowe et al.
5,473,108 A 12/1995 Matsuda et al.

(Continued)

FOREIGN PATENT DOCUMENTS

EP 0994464 4/2000

OTHER PUBLICATIONS

120XP Subharmonic Synthesizer, A Harman International Company, Nov. 5, 1997, pp. 1-2.

(Continued)

*Primary Examiner*—Xu Mei
(74) *Attorney, Agent, or Firm*—Kaplan Gilman Gibson & Dernier LLP

(57) ABSTRACT

Methods and apparatus may provide for one or more of: receiving an input signal containing frequencies from among a first range; filtering the input signal to produce a first intermediate signal containing frequencies from among a second range; producing a sub-harmonic signal from the first intermediate signal containing frequencies from among a third range, the third range of frequencies being about one octave below the second range of frequencies; canceling energy at at least some frequencies from among a fourth range of frequencies from a left channel signal of the input signal to produce at least a portion of a left channel output signal; and canceling energy at at least some frequencies from among a fifth range of frequencies from a right channel signal of the input signal to produce at least a portion of a right channel output signal.

17 Claims, 7 Drawing Sheets

U.S. PATENT DOCUMENTS

| | | | | |
|---|---|---|---|---|
| 5,604,809 | A * | 2/1997 | Tsubonuma et al. | 381/17 |
| 5,619,578 | A | 4/1997 | Sondermeyer et al. | |
| 5,647,004 | A | 7/1997 | Sondermeyer et al. | |
| 5,774,556 | A * | 6/1998 | Lowe et al. | 381/17 |
| 5,822,437 | A | 10/1998 | Winterer | |
| 6,023,513 | A | 2/2000 | Case | |
| 6,111,960 | A | 8/2000 | Aarts et al. | |
| 6,122,381 | A | 9/2000 | Winterer | |
| 6,134,330 | A | 10/2000 | DePoortere | |
| 6,307,941 | B1 * | 10/2001 | Tanner et al. | 381/17 |
| 6,335,973 | B1 | 1/2002 | Case | |
| 6,504,935 | B1 | 1/2003 | Jackson | |
| 6,507,657 | B1 * | 1/2003 | Kamada et al. | 381/17 |
| 6,845,165 | B1 | 1/2005 | Motohashi | |
| 2003/0044024 | A1 | 3/2003 | Aarts et al. | |

OTHER PUBLICATIONS

M51134P, FP Sub-Hormonizer for Bass Emphasis, Mitsubishi Sound Processor Ics, pp. 4-182 through 4-183.

U.S. Appl. No. 10/158,628, filed May 30, 2002.

U.S. Appl. No. 10/957,936, filed Oct. 4, 2004.

* cited by examiner

SUB-HARMONIC GENERATOR AND STEREO EXPANSION PROCESSOR

CROSS REFERENCE TO RELATED APPLICATIONS

This is a divisional application of U.S. patent application Ser. No. 09/727,903, filed Dec. 1, 2000 now U.S. Pat. No. 7,136,493, which claims the benefit of U.S. Provisional Patent Application No. 60/214,804, filed Jun. 28, 2000, entitled SUB-HARMONIC PROCESSOR, and U.S. Provisional Patent Application No. 60/218,805, filed Jul. 18, 2000, entitled SUB-HARMONIC PROCESSOR, the entire disclosures of which are hereby incorporated by reference.

BACKGROUND OF THE INVENTION

The present invention relates to a sub-harmonic generator for producing a synthesized signal derived from an input signal but including energy levels at frequencies not contained in the input signal, and the present invention also relates to an expansion processor for increasing the stereo width produced by signals from left and right channels.

Conventional sub-harmonic generators are used to modify an input signal to produce a sub-harmonic signal having at least some desirable characteristics. In music reproduction/processing contexts, an input signal may include frequency components taken from an audible range of about 20 Hz to about 20,000 Hz. The conventional sub-harmonic generator produces an output signal that includes energy at substantially all of the frequency components of the input signal plus additional energy at frequency components in a sub-harmonic range. In some cases, the output signal includes energy at only a subset of the frequency components of the input signal (such as a sub-woofer range) plus the additional energy in the sub-harmonic range. Usually, a range of frequency components from the input signal are utilized to derive the frequency components in the sub-harmonic range, and the input signal is augmented with the frequency components in the sub-harmonic range to obtain the output signal.

In theory, these conventional sub-harmonic generators produce desirable characteristics in the output signal, such as increased signal energy in the sub-harmonic range, thereby producing a richer base response when converted into audible sound energy. In practice, however, the audible characteristics of the output signal from conventional sub-harmonic generators suffer from a number of disadvantages, namely (i) a relatively flat (or "cardboard") audible sound is obtained from the output signal due primarily to the increase in energy from sub-harmonic frequency components without modifying other frequency characteristics of the input signal, this disadvantage may also manifest in a "rumbly" sound depending on the frequency content of the input signal; and (ii) the audible sound exhibits poor "attack" and "decay" characteristics due to an inability by the sub-harmonic generator to accurately reflect an amplitude envelope of the input signal as a function of the frequency components of interest. Thus, the energy of the output signal in the sub-harmonic frequency range does not exhibit desirable amplitude characteristics. In addition, conventional sub-harmonic generators have not effectively utilized sub-harmonic signals in stereo applications, particularly where maintaining stereo "width" is of importance.

It would be desirable to obtain a new sub-harmonic generator that avoids flat, cardboard sounding characteristics in an output signal by modifying frequency components at least partially outside the sub-harmonic range. It would also be desirable to obtain a sub-harmonic generator that exhibits superior attack and decay characteristics, preferably by using the amplitude envelope of the input signal (as a function of frequency components in the relevant frequency range) in producing the output signal. It is also desirable to obtain an expansion processor for increasing stereo width characteristics created by signals from left and right channels, particularly where sound clarity is improved above certain frequencies.

SUMMARY OF THE INVENTION

In accordance with at least one aspect of the present invention, a sub-harmonic generator includes: an input filter operable to receive an input signal containing frequencies from among a first range and to produce a first intermediate signal containing frequencies from among a second range; a signal divider circuit operable to receive the first intermediate signal and to produce a square wave signal containing square wave signal components at fundamental frequencies from among a third range, the third range of frequencies being about one octave below the second range of frequencies; a wave-shaping circuit operable to receive the square wave signal and to produce a second intermediate signal containing sinusoidal signal components from among frequencies corresponding to the respective fundamental frequencies of the square wave signal components; an RMS detector operable to produce an RMS signal corresponding to an instantaneous amplitude of the first intermediate signal; and a voltage controlled amplifier operable to amplify the second intermediate signal by an amount proportional to the RMS signal to produce a sub-harmonic signal.

In accordance with at least one other aspect of the present invention, a sub-harmonic generator includes: a sub-harmonic signal circuit operable to (i) receive an input signal containing frequencies from among a first range, (ii) filter the input signal to produce a first intermediate signal containing frequencies from among a second range, and (iii) produce a sub-harmonic signal from the first intermediate signal containing frequencies from among a third range, the third range of frequencies being about one octave below the second range of frequencies; at least one band-pass filter operable to receive the input signal and to produce a second intermediate signal containing frequencies from among a fourth range, the fourth range of frequencies including at least some frequencies above the third range of frequencies; an amplifier operable to increase an amplitude of the second intermediate signal to produce a third intermediate signal; and a summation circuit operable to sum the sub-harmonic signal and the third intermediate signal to produce at least a portion of an output signal.

In accordance with at least one other aspect of the present invention, an expansion circuit for increasing an apparent stereo width produced by a left channel signal and a right channel signal, includes: a left channel circuit operable to cancel at least some frequencies from among a first range of frequencies from the left channel signal to produce at least a portion of a left channel output signal, the at least some frequencies from among the first range of frequencies being derived from the right channel signal; and a right channel circuit operable to cancel at least some frequencies from among a second range of frequencies from the right channel signal to produce at least a portion of a right channel output signal, the at least some frequencies from among the second range of frequencies being derived from the left channel signal.

Other features of the invention will become apparent to one skilled in the art in view of the disclosure herein taken in combination with the accompanying drawings.

BRIEF DESCRIPTION OF THE DRAWINGS

For the purpose of illustrating the invention, there are shown in the drawings forms that are presently preferred, it being understood, however, that the invention is not limited to the precise arrangements and instrumentalities shown.

DETAILED DESCRIPTION

Figure 1:
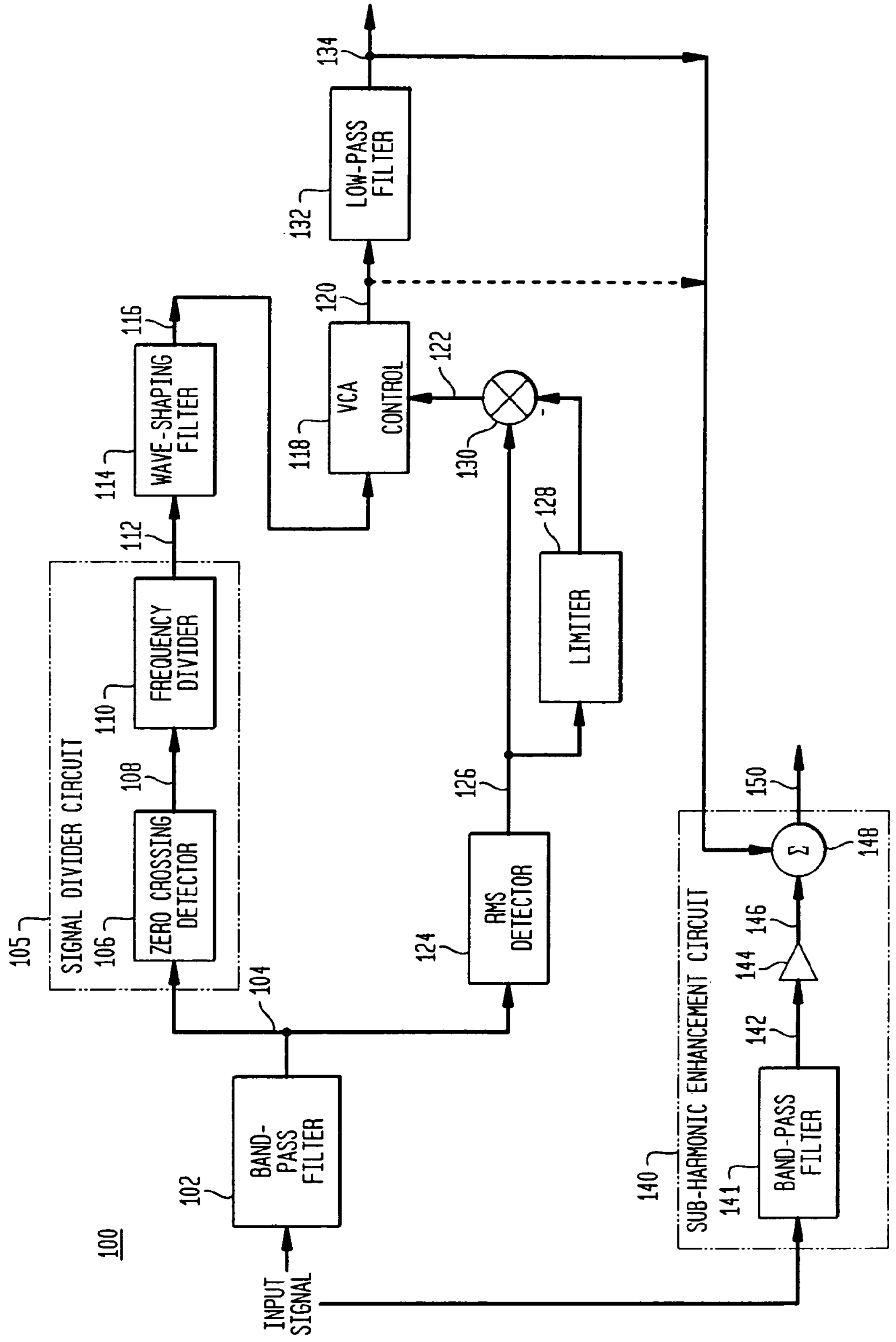
FIG. 1 is a block diagram of a sub-harmonic generator in accordance with one or more aspects of the present invention.

Turning now to the drawings wherein like numerals indicate like elements, there is shown in FIG. 1 a block diagram of a sub-harmonic generator 100 in accordance with one or more aspects of the present invention. The sub-harmonic generator 100 includes a band-pass filter 102, a signal divider circuit 105, a wave shaping filter 114, a voltage controlled amplifier 118, and an RMS detector 124. Alternative embodiments of the sub-harmonic generator 100 may also include a limiter 128, a summation circuit 130, and/or a low pass filter 132. Still further embodiments of the sub-harmonic generator 100 may also include a sub-harmonic enhancement circuit 140, which preferably includes at least one band-pass filter 141, an amplifier 144 and a summation circuit 148.

Figure 2A:
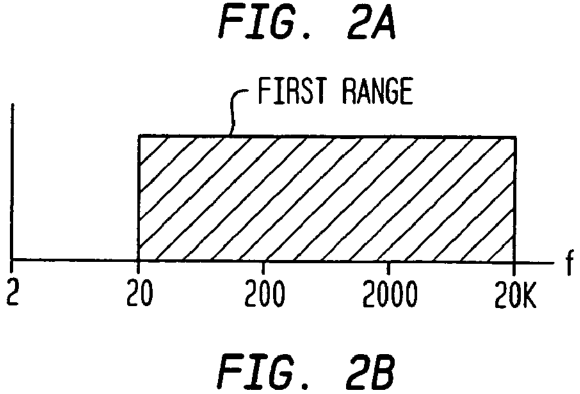
FIG. 2A is a graph (having a logarithmic ordinate scale) illustrating a possible first range of frequencies, where an input signal to the sub-harmonic generator of FIG. 1 may contain frequencies from among the first range of frequencies.

The band-pass filter 102 is preferably operable to receive an input signal containing frequencies from among a first range and to produce a first intermediate signal on node 104 containing frequencies from among a second range. Referring to FIG. 2A, the input signal may contain audible frequency components, for example, from among frequencies between about 20 Hz and about 20,000 Hz. It is understood that FIG. 2A is given by way of illustration only and is not intended to limit the scope of the present invention (e.g., the input signal may contain frequencies outside the audible frequency range and still be considered within the scope of the invention).

Figure 2B:
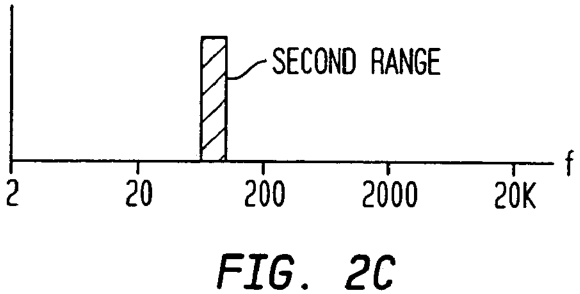
FIG. 2B is a graph (having a logarithmic ordinate scale) illustrating a possible second range of frequencies that may be included in an intermediate signal produced by the sub-harmonic generator of FIG. 1.

With reference to FIG. 2B, the second range of frequencies preferably falls within the first range of frequencies, and in the case of an audible input signal (such as music) the second range most preferably falls at a low end of the first range. Although the invention is not limited by any theory of operation, it has been found through experimentation that a second range of frequencies extending from about 40 Hz to about 110 Hz is desirable when the input signal contains audible frequencies, such as music. It has also been found through experimentation that a second range extending from about 56 Hz to about 96 Hz works particularly well when the sub-harmonic generator 100 is employed to modify an audible input signal for increasing listening pleasure.

Figure 3:
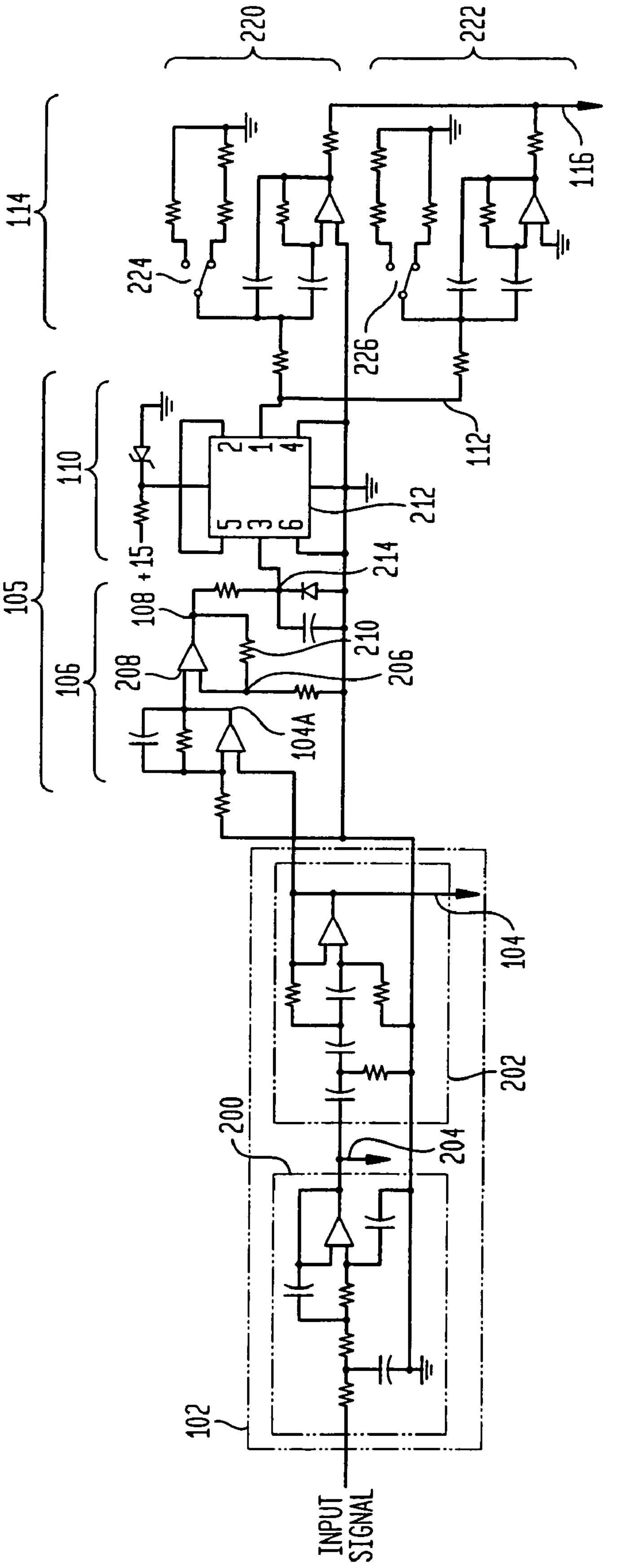
FIG. 3 is a detailed schematic illustrating examples of circuits suitable for implementing one or more functions of the sub-harmonic generator of FIG. 1.

The band-pass filter 102 may be implemented using any of the known circuit techniques. With reference to FIG. 3, the band-pass filter 102 preferably is implemented utilizing a cascaded low pass filter 200 and high pass filter 202 to produce the intermediate signal on node 104. The low pass filter 200 may be implemented by way of active circuitry (as shown) or by way of passive circuitry and may include single or multiple poles as may be desired. It is most preferred that the low pass filter 200 includes a first corner frequency substantially at an upper end of the second range of frequencies (FIG. 2B), such as at 96 Hz. Preferably, a low pass signal is obtained on node 204 that contains frequencies substantially at or below the first corner frequency, such as 96 Hz. As will be discussed in more detail hereinbelow, the low pass signal on node 204 may be utilized to produce a sub-woofer signal. The high pass filter 202 may also be implemented using active circuitry (as shown) or passive circuitry and may include a single or multiple poles may be desired. It is preferred that the high pass filter 202 includes a second corner frequency, below the first corner frequency of the low pass filter 200, substantially at a lower end of the second range of frequencies (FIG. 2B), such as at 56 Hz.

Those skilled in the art will appreciate that the low pass filter 200 and high pass filter 202 would not exhibit "brick wall" transfer characteristics as is illustrated by the second range shown in FIG. 2B; indeed, a practical band-pass filter exhibits a gradual transition in gain characteristics through the pass band and other frequencies of interest. Thus, the brick wall representations shown in FIGS. 2A–2B (and FIGS. 2C–2E for that matter) are utilized for the sake of clarity, e.g., to illustrate the frequency interrelationships between respective ranges. In a practical circuit, however, the first range, second range, etc. will probably exhibit gradual transitions in gain through frequencies of interest. Consequently, a determination as to whether a frequency is "within" or "outside" a particular range illustrated is intended to be made with the understanding that gradual attenuation may be obtained at frequencies near corner frequencies of the band-pass filter 102 (and the other filters discussed hereinbelow).

Figure 2C:
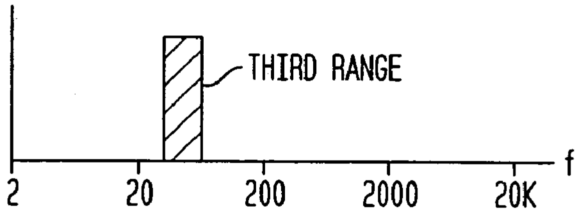
FIG. 2C is a graph (having a logarithmic ordinate scale) illustrating a possible third range of frequencies that may be included in another intermediate signal produced by the sub-harmonic generator-harmonic generator of FIG. 1.

Referring again to FIG. 1, the signal divider circuit 105 is preferably operable to receive the intermediate signal on node 104 and to produce a square wave signal on node 112, where the square wave signal contains square wave signal components at frequencies about one octave below the second range of frequencies. With reference to FIG. 2C, the square wave signal components preferably include frequencies from among a third range of frequencies that are about one octave below the second range of frequencies. Thus, when the second range of frequencies extends from about 40 Hz to about 110 Hz, the third range of frequencies preferably extends from about 20 Hz to about 55 Hz. It has been found through experimentation that particularly advantageous and pleasing listening results are obtained when the third range of frequencies extends from about 28 Hz to about 48 Hz. It is noted that the square wave signal on node 112 will include signal energy at fundamental frequencies substantially within the third range of frequencies and harmonic frequencies substantially outside the third range of frequencies. For simplicity, however, the third range of frequencies illustrated in FIG. 2C shows only the fundamental frequency components and omits the harmonic frequency components of the square wave signal.

Preferably, the signal divider circuit 105 includes a zero crossing detector 106 and a frequency divider circuit 110. The zero crossing detector 106 is preferably operable to produce a zero crossing signal on node 108 that transitions each time the intermediate signal on node 104 substantially matches a reference potential. Any of the known circuit implementations for carrying out the functions of the zero crossing detector 106 may be used and are considered within the scope of the invention. For example, with reference to FIG. 3, a detailed schematic of a zero crossing detector 106 is illustrated. The zero crossing detector 106 preferably includes a comparator 208 operable to compare respective amplitudes of a reference potential on node 206 and the intermediate signal on node 104. It is noted that the intermediate signal on node 104 preferably passes through an amplifier/buffer stage to produce a similar intermediate signal on node 104A, although this stage is not required to carry out the invention. The zero crossing signal on node 108 transitions from high-to-low or low-to-high each time the amplitude of the reference potential on node 206 substantially equals the intermediate signal on node 104A. The "high" and "low" levels are a function of the specific circuit implementation. Here, the high level is about 15 V and the low level is about 0 V (or ground potential).

The zero crossing detector circuit 106 preferably includes a hysteresis circuit operable to adjust the amplitude of the reference potential on node 206 each time the zero crossing signal on node 108 transitions from high-to-low or low-to-high. By way of example, a resistor 210 is coupled from node 108 to an input terminal (here, the noninverting input terminal) of the comparator circuit 208, which is also node 206. Thus, each time the zero crossing signal on node 108 transitions, more or less voltage amplitude is induced on node 206, thereby adjusting the reference potential. The hysteresis prevents undesirable oscillations in the zero crossing signal on node 108 and also tends to eliminate beat frequency signal components that may be present in the intermediate signal on node 104A.

Referring now to FIGS. 1 and 3, the frequency divider circuit 110 is preferably operable to receive the zero crossing signal on node 108 and to produce the square wave signal on node 112 such that the square wave signal transitions once each time the zero crossing signal transitions twice. Any of the known circuit implementations for carrying out the function of the frequency divider circuit 110 may be employed. Preferably, the frequency divider circuit 110 is implemented using a flip-flop circuit 212, such as an edge sensitive flip-flop or a level sensitive flip-flop. The zero crossing signal on node 108 is coupled to a clock terminal (node 214) of the flip-flop circuit 212. An amplitude limiting circuit employing a resistor, zenor diode, and capacitor are employed to ensure that the amplitude of the zero crossing circuit on node 108 does not damage the flip-flop circuit 212. The square wave signal on node 112 will transition once each time the zero crossing signal on node 214 transitions twice. This advantageously results in a square wave signal on node 112 that contains fundamental frequencies within the third range of frequencies (FIG. 2C). While the square wave signal on node 112 contains fundamental square wave frequencies in the third range (i.e., the sub-harmonic frequency range), it also contains undesirable harmonic frequencies outside the third range due to the harsh transitions of the square wave created by the flip-flop circuit 212. The square wave signal transitions between high and low values (e.g., 5 V and 0 V), and, therefore does not contain any information concerning the amplitude envelope of the input signal at frequencies of interest, e.g., in the second range.

Turning again to FIG. 1, the wave shaping filter 114 is preferably operable to receive the square wave signal on node 112 and to attenuate frequencies substantially outside the third range of frequencies and to produce an intermediate signal on node 116 that contains sinusoidal frequency components at frequencies corresponding substantially to the fundamental frequency components of the square wave signal on node 112. Thus, the intermediate signal on node 116 contains energy at frequencies from among the third range (e.g., the sub-harmonic range) without substantial energy at frequencies outside the third range. Any of the known circuit implementations capable of carrying out the function of the wave shaping filter 114 may be employed. With reference to FIG. 3, it is preferred that the wave shaping filter 114 includes a plurality of band-pass filters, each receiving the square wave signal on node 112 and having a respective center frequency such that a sum of outputs of the band-pass filters substantially exclude frequencies outside the third range. Most preferably, the wave shaping filter 114 includes a first band-pass filter 220 and a second band-pass filter 222, where the first band-pass filter 220 has a center frequency within about 25 Hz to about 35 Hz and the second band-pass filter 222 has a center frequency within about 40 Hz to about 50 Hz. It is most preferred that the first band-pass filter 220 has a Q-factor from about 3.0 to about 3.5 and that the second band-pass filter 222 has a Q-factor from about 3.5 to about 4.5. Preferably, at least one of the band-pass filters 220, 222 includes a selectable center frequency such that the attenuated frequencies substantially outside the third range of frequencies are adjustable. By way of example, this adjustment may be obtained via single-pole-double-throw switches 224, 226, which are preferably ganged such that they switch bilaterally. Advantageously, a listener could adjust the energy content of the intermediate signal on node 116 by way of switches 224, 226 to suit his or her listening tastes or to ensure compatibility with other equipment, such as speaker equipment, etc.

With reference to FIG. 1, the voltage controlled amplifier 118 is preferably operable to amplify the intermediate signal on node 116 by an amount proportional to an RMS value of the intermediate signal on node 104. This RMS value is preferably produced by the RMS detector 124 and the RMS signal on node 126 preferably corresponds to an instantaneous amplitude of the intermediate signal on node 104. The limiter 128 and summation circuit 130 are preferably employed to reduce the instantaneous amplitude of the RMS signal on node 126 if it exceeds a threshold, for example, a threshold which when exceeded would overload the voltage controlled amplifier 118. The output of the voltage controlled amplifier 118 on node 120 is a sub-harmonic signal containing energy at frequencies which were not in the original input signal, but which corresponds to energy at frequencies of the input signal within the second range of frequencies. Advantageously, the RMS detector 124 ensures that the amplitude envelope of the sub-harmonic signal on node 120 substantially corresponds to the amplitude envelope of the intermediate signal on node 104 even though the frequency content of the sub-harmonic signal on node 120 falls within a range approximately one octave below the frequency content of the intermediate signal on node 104. It has been found that the correspondence of the amplitude envelope of the sub-harmonic signal on node 120 with the amplitude envelope of the intermediate signal on node 104 results in very pleasing audible characteristics when the input signal contains audio data, such as music.

Figure 4:
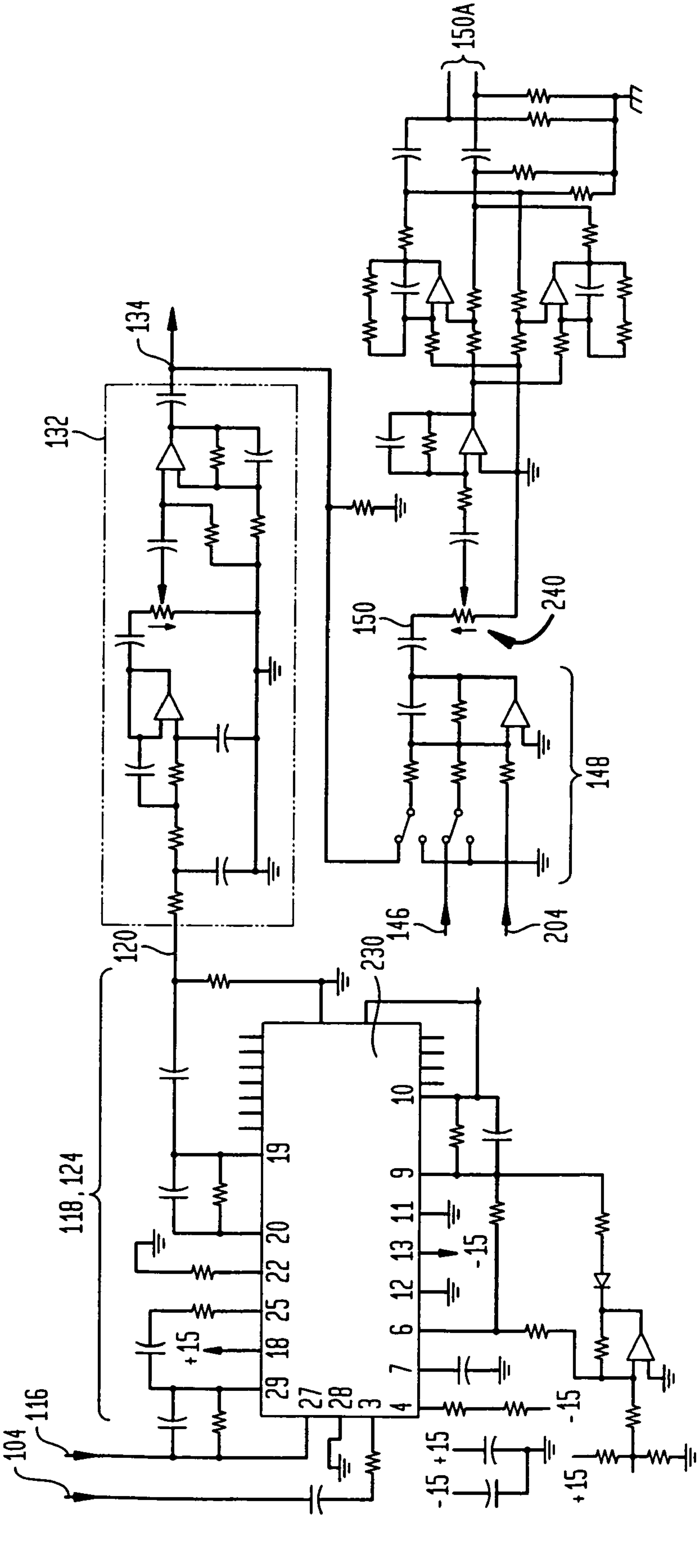
FIG. 4 is a detailed schematic illustrating examples of circuits that may be utilized to implement one or more further functions of the sub-harmonic generator of FIG. 1.

Any of the known circuit implementations that are capable of carrying out the functions of one or both of the voltage controlled amplifier 118 and the RMS detector 124 may be employed. With reference to FIG. 4, both functions of the voltage controlled amplifier 118 and the RMS detector 124 are preferably carried out utilizing an integrated circuit 230, such as the 4301H, purchasable from the THAT Corporation.

With reference to FIG. 1, the low pass filter 132 is preferably employed to receive the sub-harmonic signal on node 120 and to produce a filtered sub-harmonic signal on node 134, where undesirable high frequency components of the sub-harmonic signal on node 120 are attenuated. These unwanted high frequencies are sometimes produced by non-ideal circuit characteristics of the voltage controlled amplifier 118, etc.

Figure 2D:
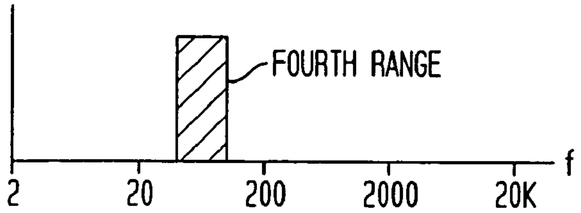
FIG. 2D is a graph (having a logarithmic ordinate scale) illustrating a possible fourth range of frequencies that may be included in still another intermediate signal produced by the sub-harmonic generator of FIG. 1.

Referring to FIG. 1, in accordance with at least one further aspect of the present invention, the sub-harmonic generator 100 of the present invention preferably includes a sub-harmonic enhancement circuit 140 that is operable to boost energy of the input signal at frequencies from among a fourth range of frequencies (FIG. 2D) and aggregate the sub-harmonic signal taken at node 120 or node 134 with the boosted energy at those frequencies. The sub-harmonic enhancement circuit 140 preferably includes a band-pass filter 141, an amplifier 144, and a summation circuit 148. The band-pass filter 141 is preferably operable to receive the input signal and to produce an intermediate signal on node 142 containing frequencies from among the fourth range of frequencies. With reference to FIG. 2D, it has been found through experimentation that desirable audible characteristics are obtained in the enhanced sub-harmonic signal on node 150 when the fourth range of frequencies extends from about 40 Hz to about 100 Hz. It is most preferred that the band-pass filter 141 includes one or more band-pass filters each having a respective center frequency such that aggregated outputs from the band-pass filters result in the intermediate signal on node 142.

Figure 5:
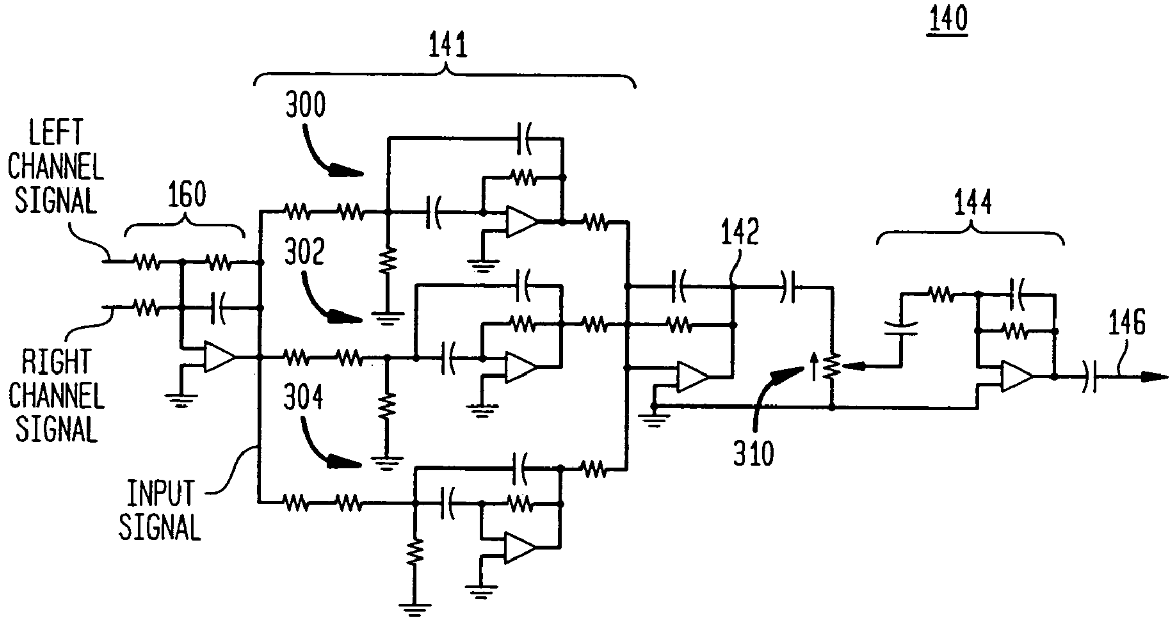
FIG. 5 is a detailed schematic diagram illustrating an example of one or more circuits suitable for implementing one or more further functions of the sub-harmonic generator of FIG. 1.

With reference to FIG. 5, one example of a circuit implementation for the sub-harmonic enhancement circuit 140, and the band-pass filter 141 in particular, is illustrated. It is most preferred that the band-pass filter 141 include first, second and third band-pass filters 300, 302, 304 having respective center frequencies such that a sum of outputs of the band-pass filters 300, 302, 304 exclude frequencies substantially outside the fourth range. It has been found that desirable characteristics are obtained in the intermediate signal on node 142 when (i) the first band-pass filter 300 has a center frequency within about 35 Hz to about 45 Hz, (ii) the second band-pass filter 302 has a center frequency within about 55 Hz to about 65 Hz, (iii) and the third band-pass filter 304 has a center frequency within about 95 Hz to about 105 Hz. It is most preferred that the first band-pass filter 200 has a center frequency of about 40 Hz, the second band-pass filter 302 has a center frequency of about 58 Hz, and the third band-pass filter 304 has a center frequency of about 98 Hz. It has been found that Q-factors for the band-pass filters 300, 302, 304 may also affect the desirable qualities of the intermediate signal on node 142. Experimentation has revealed that advantageous results are obtained when the first band-pass filter 300 has a Q-factor from about 1.5 to about 2.0, the second band-pass filter 302 has a Q-factor from about 1.75 to about 2.25, and the third band-pass filter 304 has a Q-factor from about 1.75 to about 2.25. It is most preferred that the Q-factor of the first band-pass filter 300 is about 1.86, the Q-factor of the second band-pass filter 302 is about 2.0, and the Q-factor of the third band-pass filter 304 is about 2.0.

It is noted that the input signal may be obtained from any of the known sources, such as music recording media, other audio processors, etc. By way of example, the input signal is preferably derived from a stereo signal comprised of a left channel and a right channel. As shown in FIG. 5, the input signal is preferably obtained by way of a summation circuit 160 operable to add a left channel signal and right channel signal to produce the input signal.

Referring to FIG. 1, the amplifier 144 is preferably operable to increase an amplitude of the intermediate signal on node 142 to produce an intermediate signal on node 146. It is most preferred that the sub-harmonic enhancement circuit 140 include an adjustment control operable to vary the magnitude of the intermediate signal on node 146. The adjustment control may be integral to the amplifier 144 or separate without departing from the scope of the invention. Any of the known circuit implementations for carrying out the functions of the amplifier 144 and/or adjustment control may be utilized. With reference to FIG. 5, the amplifier 144 is preferably implemented by way of operational amplifier(s) and other supporting circuit components. The adjustment control is preferably achieved by way of a potentiometer 310 operable to adjust the amplitude of the intermediate signal on node 142.

Referring now to FIGS. 1 and 4, the summation circuit 148 is preferably operable to sum the sub-harmonic signal (from node 120 or node 134) and the intermediate signal on node 146 to produce the enhanced sub-harmonic signal on node 150. Any of the known circuit implementations may be utilized to carry out the function of the summation circuit 148. With particular reference to FIG. 4, the summation circuit 148 is preferably implemented utilizing a conventional summing operational amplifier circuit. The filtered sub-harmonic signal on node 134 produced by the low pass filter 132 and the intermediate signal on node 146 are input to the summation circuit 148 to produce the enhanced sub-harmonic signal on node 150. Preferably, the summation circuit 148 is further operable to sum the (i) the sub-harmonic signal on node 134; (ii) the intermediate signal on node 146 and (iii) the low pass signal on node 204 to produce an enhanced sub-harmonic signal on node 150 suitable for use in a sub-woofer audio application. It is most preferred that a cut-out circuit is employed (integral or separate from the summation circuit 148) operable to disconnect the filtered sub-harmonic signal on node 134 and the intermediate signal on node 146 from the summation circuit 148 such that a pure sub-woofer signal is obtained on node 150. Advantageously, a user is thereby permitted to adjust characteristics of the signal on node 150 as desired. Further equalization and/or filtering circuitry may be employed to obtain a more desirable version of the enhanced sub-harmonic signal on node 150A.

Figure 6:
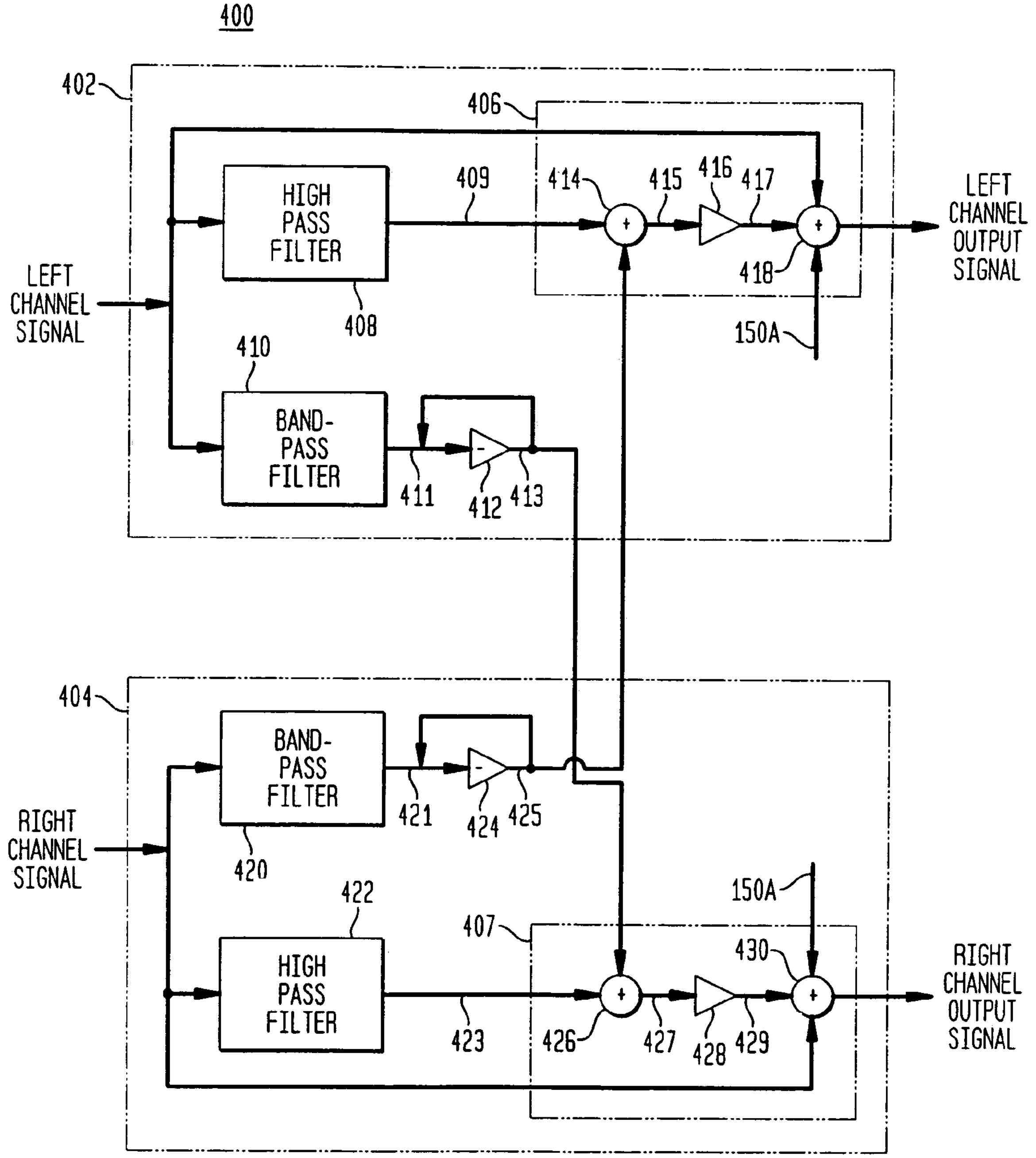
FIG. 6 is a block diagram of an expansion processor for increasing an apparent stereo width produced by left and right channel signals in accordance with one or more aspects of the present invention.

In accordance with at least one other aspect of the invention, the sub-harmonic generator 100 preferably works in conjunction with a stereo audio processor. With reference to FIG. 6, one such audio processor is preferably an expansion circuit 400 for increasing an apparent stereo width produced by a left channel signal and a right channel signal. The expansion circuit 400 preferably includes a left channel circuit 402 and a right channel circuit 404 for adjusting respective characteristics of the left channel signal and the right channel signal. The left channel signal and right channel signal may, for example, be the same channel signals utilized to produce the input signal as discussed above with respect to the summation circuit 160 of FIG. 5.

Figure 2E:
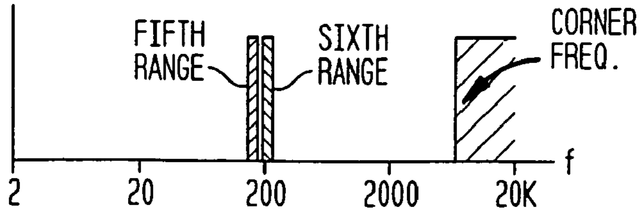
FIG. 2E is a graph (having a logarithmic ordinate scale) illustrating further possible ranges of frequencies that may be contained in one or more further intermediate signals produced by other components used to implement the present invention.

Preferably, the left channel circuit 402 is operable to cancel energy at at least some frequencies from among a fifth range of frequencies from the left channel signal to produce at least a portion of a left channel output signal. It is most preferred that at least some of the frequencies from among the fifth range of frequencies are derived from the right channel signal. Similarly, the right channel circuit 404 is preferably operable to cancel energy at at least some frequencies from among a sixth range of frequencies from the right channel signal to produce at least a portion of a right channel output signal. It is most preferred that at least some of the frequencies from among the sixth range of frequencies are derived from the left channel signal. With reference to FIG. 2E, it has been discovered through experimentation that advantageous results are obtained when one of the fifth and sixth ranges of frequencies extends from about 175 Hz to about 225 Hz and the other of the fifth and sixth ranges of frequencies extends from about 150 Hz to about 200 Hz. Advantageously, removing energy at these selected frequency ranges from respective ones of the left and right channel signals in this manner effectively widens the apparent stereo produced when the left channel output signal and right channel output signal are converted into audible energy.

Referring to FIG. 6, the left channel circuit 402 preferably includes a high pass filter 408, a band-pass filter 410, an inverting amplifier 412, and a left channel summation circuit 406. The left channel summation circuit 406 preferably includes a first summation circuit 414, an amplifier 416, and a second summation circuit 418. The right channel circuit 404 preferably includes a band-pass filter 420, a high pass filter 422, an inverting amplifier 424, and a right channel summation circuit 407. The right channel summation circuit 407 preferably includes a first summation circuit 426, an amplifier 428, and a second summation circuit 430.

The band-pass filter 410 of the left channel circuit 402 preferably has a center frequency at about a mid-frequency of the fifth or sixth range of frequencies. For the purposes of illustrating the invention, it is assumed that the center frequency of the band-pass filter 410 is at about a mid-frequency of the sixth range of frequencies and is operable to produce an intermediate signal on node 411 containing frequencies of the left channel signal falling substantially within the sixth range of frequencies. The inverting amplifier 412 is preferably operable to produce an inverted left channel signal on node 413 from the intermediate signal on node 411. Similarly, the band-pass filter 420 of the right channel circuit 404 preferably has a center frequency at about a mid-frequency of the fifth range of frequencies to produce an intermediate signal on node 421 containing frequencies of the right channel signal falling substantially within the fifth range of frequencies. The inverting amplifier 424 preferably produces an inverted right channel signal on node 425 from the intermediate signal on node 421.

The left channel summation circuit 406 is preferably operable to sum at least the left channel signal and the inverted right channel signal on node 425 to produce at least a portion of the left channel output signal. Similarly, the right channel summation circuit 407 is preferably operable to sum at least the right channel signal and the inverted left channel signal on node 413 to produce at least a portion of the right channel output signal. Since the inverted right channel signal on node 425 has frequency, amplitude and phase characteristics such that energy of the left channel signal at frequencies from among the fifth range of frequencies are substantially attenuated, energy of the right channel output signal falling within the fifth range of frequencies will be of greater significance when compared to the left channel output signal and, therefore, they will also have a greater affect on a listener to the stereo signal produced by the left and right channel output signals. A parallel effect is achieved by reducing energy of the right channel signal falling within the sixth range of frequencies as determined by the left channel signal to produce the right channel output signal. This advantageously widens the perceived stereo produced by the left and right channel output signals.

Preferably, the high pass filter 408 of the left channel circuit 402 is operable to receive the left channel signal and produce a left channel high pass signal on node 409 containing frequencies from among those at or above a first corner frequency. With reference to FIG. 2E, the first corner frequency is preferably substantially above any of the second, third, fourth, fifth, or sixth frequency ranges. It has been found that a first corner frequency of about 5.3 KHz yields advantageous characteristics in the left channel output signal. Preferably, the left channel summation circuit 406 is further operable to sum the left channel signal, the inverted right channel signal on node 425, and the left channel high pass signal on node 409. More specifically, the first summation circuit 414 is preferably operable to sum the left channel high pass signal on node 409 and the inverted right channel signal on node 425 to produce a left channel expansion signal on node 415. The second summation circuit 418 is preferably operable to sum at least the left channel signal and the left channel expansion signal on node 415 to produce at least a portion of the left channel output signal. Preferably, amplifier 416 is operable to adjust an amplitude of the left channel expansion signal on node 415 to vary an amount of that signal available to sum with the left channel signal. Advantageously, this permits a user to adjust the characteristics of the left channel output signal.

The high pass filter 422 and right channel summation circuit 407 of the right channel circuit 404 operate in substantially the same way as the high pass filter 408 and the left channel summation circuit 406 of the left channel circuit 402 except the intermediate signals produced are with respect to the right channel signal and the right channel output signal. Therefore, a detailed description of their operation is omitted for clarity.

Preferably, the high pass filter 408 and the high pass filter 422 are further operable to amplify frequency components of the left channel signal and the right channel signal, respectively, at or above the respective first and second corner frequencies. This results in further advantages in widening the apparent stereo signal produced by the left channel output signal and the right channel output signal. It also "brightens" the resulting audible signal. It is preferred that both the first and second corner frequencies are at about 5.3 KHz.

In accordance with at least one further aspect of the invention, a sub-harmonic generator, such as the sub-harmonic generator 100 of FIG. 1, is utilized in conjunction with the expansion circuit 400 of FIG. 6. In particular, the sub-harmonic signal on node 120, the filtered sub-harmonic signal on node 134, the enhanced sub-harmonic signal on node 150, or the sub-harmonic signal on node 150A is preferably input to both the left channel summation circuit 406 and the right channel summation circuit 407 to produce at least a portion of the left channel output signal and the right channel output signal. With reference to FIG. 4, it is preferred that the enhanced sub-harmonic signal at node 150A is derived from the enhanced sub-harmonic signal at node 150. For example, the enhanced sub-harmonic signal on node 158 is preferably adjustable by way of potentiometer 40 such that a user can adjust an amplitude of the enhanced sub-harmonic signal on node 150A. Turning again to FIG. 6, the enhanced sub-harmonic signal on node 150A is preferably added to the left channel signal and the left expansion signal on node 415, 417 by way of the second summation circuit 418 to produce the left channel output signal. Similarly, the enhanced sub-harmonic signal on node 150A is preferably added to the right channel signal and the right expansion signal on nodes 427, 429 to produce the right channel output signal.

Figure 7:
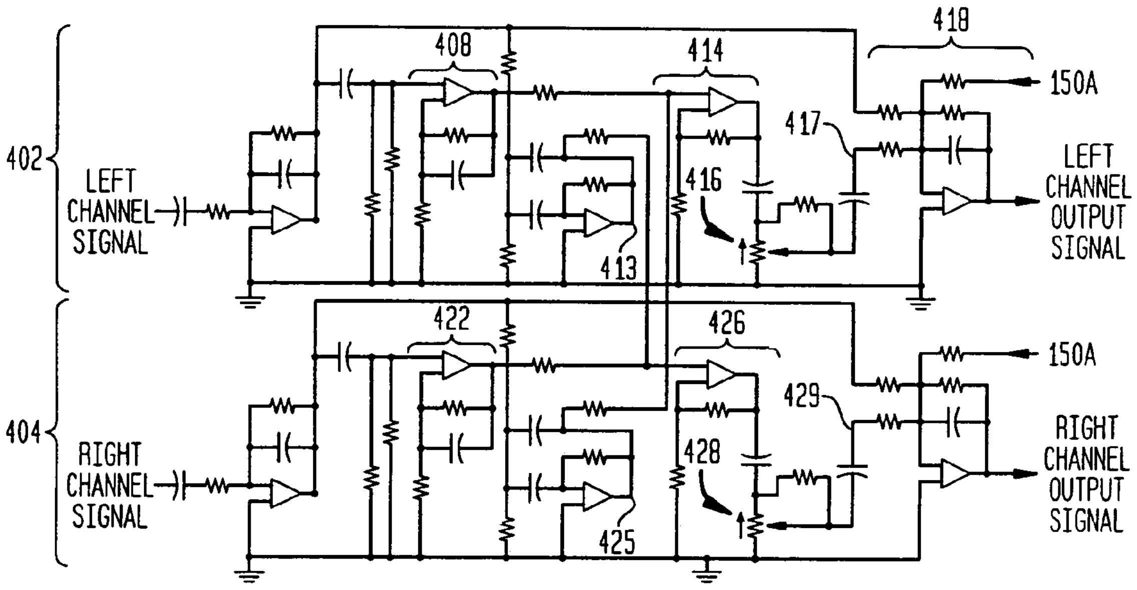
FIG. 7 is a detailed schematic diagram illustrating one or more circuits suitable for implementing one or more functions of the expansion processor of FIG. 6.

Any of the known circuit implementations may be utilized to implement the functions of the left channel circuit 402 and the right channel circuit 404. With reference to FIG. 7, a preferred schematic is shown which illustrates one way of implementing the functions of the expansion circuit 400.

The above aspects of the present invention enjoy wide application, particularly in the audio context. For example, stereo systems, home theaters, car stereos, drum equipment, sound systems utilized by disc jockeys, etc. may utilize one or more aspects of the invention to improve audible sound quality and, therefore, increase user satisfaction.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An apparatus, comprising:

an expansion circuit for increasing an apparent stereo width produced by a left channel signal and a right channel signal, the expansion circuit including:

a left channel circuit operable to cancel energy at at least some frequencies from among a first range of frequencies from the left channel signal to produce at least a portion of a left channel output signal, the at least some frequencies from among the first range of frequencies being derived from a right channel signal, the left channel circuit including a left channel band-pass filter having a center frequency at about a mid-frequency of a second range of frequencies, the left channel band-pass filter being operable to produce an inverted left channel signal containing a band of frequencies from among the second range of frequencies; and a right channel circuit operable to cancel energy at at least some frequencies from among the second range of frequencies from the right channel signal to produce at least a portion of the right channel output signal, the at least some frequencies from among the second range of frequencies being derived from the left channel signal, the right channel circuit including a right channel band-pass filter having a center frequency at about a mid-frequency of the first range of frequencies, the right channel band-pass filter being operable to produce an inverted right channel signal containing a band of frequencies from among the first range of frequencies, wherein:

the left channel circuit further includes a left channel summation circuit operable to sum at least the left channel signal and the inverted right channel signal to produce at least a portion of the left channel output signal; and the right channel circuit further includes a right channel summation circuit operable to sum at least the right channel signal and the inverted left channel signal to produce at least a portion of the right channel output signal.

2. The apparatus of claim 1, wherein:

the inverted left channel signal has frequency, amplitude and phase characteristics such that energy of the right channel signal at frequencies from among the second range of frequencies are substantially attenuated when the right channel signal and the inverted left channel signal are summed to produce at least a portion of the right channel output signal; and the inverted right channel signal has frequency, amplitude and phase characteristics such that energy of the left channel signal at frequencies from among the first range of frequencies are substantially attenuated when the left channel signal and the inverted right channel signal are summed to produce at least a portion of the left channel output signal.

3. The apparatus of claim 1, wherein at least one of:

a center frequency of one of the left channel band-pass filter and the right channel band-pass filter is within about 175 Hz to about 225 Hz and a center frequency of the other of the left channel band-pass filter and the right channel band-pass filter is within about 150 Hz to about 200 Hz; and a center frequency of one of the left channel band-pass filter and the right channel band-pass filter is about 200 Hz and a center frequency of the other of the left channel band-pass filter and the right channel band-pass filter is about 175 Hz.

4. The apparatus of claim 1, wherein:

the left channel circuit further includes a left channel high-pass filter operable receive the left channel signal and to produce a left channel high pass signal containing frequencies from among those at or above a first corner frequency;

the right channel circuit further includes a right channel high-pass filter operable to receive the right channel signal and to produce a right channel high pass signal containing frequencies from among those at or above a second corner frequency;

the left channel summation circuit is further operable to sum at least the left channel signal, the inverted right channel signal, and the left channel high pass signal to produce at least a portion of the left channel output signal; and the right channel summation circuit is further operable to sum at least the right channel signal, the inverted left channel signal, and the right channel high pass signal to produce at least a portion of the right channel output signal.

5. The apparatus of claim 4, wherein the left channel high-pass filter is further operable to amplify energy of the left channel signal at or above the first corner frequency to produce the left channel high pass signal; and the right channel high-pass filter is further operable to amplify energy of the right channel signal at or above the second corner frequency to produce the right channel high pass signal.

6. The apparatus of claim 4, wherein:

the left channel summation circuit includes (i) a first summation circuit operable to sum at least the left channel high pass signal and the inverted right channel signal to produce a left expansion signal, and (ii) a second summation circuit operable to sum at least the left channel signal and the left expansion signal to produce at least a portion of the left channel output signal; and the right channel summation circuit includes (i) a first summation circuit operable to sum at least the right channel high pass signal and the inverted left channel signal to produce a right expansion signal, and (ii) a second summation circuit operable to sum at least the right channel signal and the right expansion signal to produce at least a portion of the right channel output signal.

7. The apparatus of claim 6, wherein the stereo width expansion circuit further includes a left channel adjustment control operable to vary a magnitude of the left expansion signal and a right channel adjustment control operable to vary a magnitude of the right expansion signal.

8. The apparatus of claim 4, wherein at least one of:

the first corner frequency is about 5.3 KHz; and the first and second corner frequencies are about 5.3 KHz.

9. The apparatus of claim 1, further comprising:

a sub-harmonic signal circuit operable to (i) receive an input signal containing frequencies from among a first range, (ii) filter the input signal to produce a first intermediate signal containing frequencies from among a second range, and (iii) produce a sub-harmonic signal from the first intermediate signal containing frequencies from among a third range, the third range of frequencies being about one octave below the second range of frequencies.

10. A method, comprising:

receiving a left channel signal and a right channel signal of a stereo signal;

producing an intermediate left channel signal from the left channel signal containing a band of frequencies from among a second range of frequencies;

producing a left channel high pass signal from the left channel signal such that it contains frequencies from among those at or above a first corner frequency;

producing an intermediate right channel signal from the right channel signal containing a band of frequencies from among a first of frequencies;

aggregating at least the left channel signal, the intermediate right channel signal, and the left channel high pass signal to produce at least a portion of the left channel output signal;

producing an input signal from the stereo signal containing frequencies from among a first range;

filtering the input signal to produce a first intermediate signal containing frequencies from among a second range; and producing a sub-harmonic signal from the first intermediate signal containing frequencies from among a third range, the third range of frequencies being about one octave below the second range of frequencies.

11. The method of claim 10, wherein:

the intermediate left channel signal has frequency, amplitude and phase characteristics such that energy of the right channel signal at frequencies from among the second range of frequencies are substantially attenuated when the intermediate left channel signal is subtracted from the right channel signal; and the intermediate right channel signal has frequency, amplitude and phase characteristics such that energy of the left channel signal at frequencies from among the first of frequencies are substantially attenuated when the intermediate right channel signal is subtracted from the left channel signal.

12. The method of claim 10, wherein at least one of:

one of the first and second ranges of frequencies is about 175 Hz to about 225 Hz and the other of the first and second ranges of frequencies is about 150 Hz to about 200 Hz; and a center frequency of one of the first and second ranges of frequencies is about 200 Hz and a center frequency of the other of the first and second ranges of frequencies is about 175 Hz.

13. The method of claim 10, farther comprising:

producing a right channel high pass signal from the right channel signal such that it contains frequencies from among those at or above a second corner frequency; and aggregating at least the right channel signal, the intermediate left channel signal, and the right channel high pass signal to produce at least a portion of the right channel output signal.

14. The method of claim 13, wherein:

the step of producing the left channel high-pass signal includes amplifying energy of the left channel signal at or above the first corner frequency to produce the left channel high pass signal; and the step of producing the right channel high-pass signal includes amplifying energy of the right channel signal at or above the second corner frequency to produce the right channel high pass signal.

15. The method of claim 13, wherein:

the step of producing at least a portion of the left channel output signal includes (i) aggregating at least the left channel high pass signal and the intermediate right channel signal to produce a left expansion signal, and (ii) summing at least the left channel signal and the left expansion signal to produce at least a portion of the left channel output signal; and the step of producing at least a portion of the right channel output signal includes (i) aggregating at least the right channel high pass signal and the intermediate left channel signal to produce a right expansion signal, and (ii) summing at least the right channel signal and the right expansion signal to produce at least a portion of the right channel output signal.

16. The method of claim 15, further comprising varying a magnitude of the left expansion signal and a magnitude of the right expansion signal.

17. The method of claim 10, farther comprising:

aggregating the left channel signal and the right channel signal to produce the input signal;

summing the left channel signal and the sub-harmonic signal to produce at least a portion of the left channel output signal; and summing the right channel signal and the sub-harmonic signal to produce at least a portion of the right channel output signal.

* * * * *